United States Patent [19]

Hino et al.

[11] Patent Number: 4,882,479

[45] Date of Patent: Nov. 21, 1989

[54] OPTICAL ROTARY ENCODER USING DUAL FREQUENCY BEAT DIFFERENCE

[75] Inventors: Motohito Hino, Nagoya; Yoshinori Bessho, Age, both of Japan

[73] Assignee: Brother Kogyo Kabushiki Kaisha, Aichi, Japan

[21] Appl. No.: 260,569

[22] Filed: Oct. 21, 1988

[30] Foreign Application Priority Data

Oct. 22, 1987 [JP] Japan ................... 62-266918

[51] Int. Cl.$^4$ ................................. G01D 5/34
[52] U.S. Cl. ..................... 250/231 SE; 356/375
[58] Field of Search .............. 250/231 SE; 356/375

[56] References Cited

U.S. PATENT DOCUMENTS 4,638,155 1/1987 Dorr ...................... 250/231 SE
4,829,342 5/1989 Nishimura ............. 250/231 SE Primary Examiner—Edward P. Westin
Assistant Examiner—Khaled Shami
Attorney, Agent, or Firm—Oliff & Berridge

[57] ABSTRACT

A rotary encoder includes a laser device which emits a laser beam having beats caused by superposition of a parallel wave and a vertical wave, which have mutually different frequencies and whose oscillating surfaces are normal to each other. A part of the beating laser beam is led to a first detector where the beat frequency of the original laser beam is detected. The remaining laser beam is split into the parallel and vertical waves by a splitting/irradiating device, and the parallel wave is irradiated onto a predetermined position of the rotational member and is scattered or reflected upon Doppler shifting attendant to the rotation of the rotational member. The scattered or reflected parallel and vertical waves are led to a synthesizer where both waves are synthesized to provide a laser beam with beats. The synthesized laser beam is led to a second detector where the beat frequency of the laser beam after being Doppler shifted is detected. The thus detected beat frequency and the beat frequency detected in the first detector are supplied to an arithmetic unit. The arithmetic unit computes a rotational angle of the rotational member in accordance therewith.

24 Claims, 7 Drawing Sheets

OPTICAL ROTARY ENCODER USING DUAL FREQUENCY BEAT DIFFERENCE

BACKGROUND OF THE INVENTION

The present invention relates to an optical rotary encoder.

Conventional optical rotary encoders include a pulse scale type using a rotational disk formed with slits and a Doppler type using a rotational disk formed with a diffraction grating.

FIG. 15 illustrates an example of the arrangement of the pulse scale type rotary encoder. As shown in FIG. 15, the pulse scale type rotary encoder includes a disk 33 formed with slits 32 at equi-interval along its circumferential direction. The center of the disk 33 is attached to a rotational shaft 31. The rotary encoder further includes a light emitting element 34 and a light receiving element 35 disposed to confront with each other with the slits 32 intervened therebetween. Light emitted from the light emitting element 34 is received in the light receiving element 35 in a form of a pulse signal in synchronization with the intervals between the slits 32 and in association with the rotational speed of the shaft 31. The number of the pulses is counted to provide a rotational angle of the rotational shaft 31.

The Doppler type rotary encoder is proposed in, for example, Japanese Patent Application Publication (Unexamined) No. 61-66927, which discloses a rotary encoder comprising a radiation grating formed on the periphery of a rotational disk. It detects the rotational angle of the disk based on the amount of a Doppler shift or Dopper frequency of the diffraction light of a laser beam irradiated onto the radiation grating.

The above scale type rotary encoder needs smaller intervals between the slits 32 in order to improve the detection accuracy. However, light diffraction occurs if the intervals between the slits are excessively narrowed, with the result that the detection accuracy is adversely reduced. To avoid the diffraction, the disk 33 should have a larger diameter.

With the rotary encoder proposed in the aforementioned Japanese Patent Application Publication, it is necessary to for a laser beam to be reflected, deflected and synthesized in a complicated manner to irradiate the beam onto two points on a rotational disk in order to avoid errors due to unequal pitch between adjacent radiation gratings or due to a possible eccentric mounting of the rotational disk. Further, the rotational direction cannot be detected without using such a complicated system. Furthermore, a detection error may occur due to a variation in frequency of an oscillated light caused by a laser device per se.

SUMMARY OF THE INVENTION

Accordingly, it is an object of this invention to eliminate the foregoing problems accompanying the conventional rotary encoders, and to provide a rotary encoder which comprises:

a laser device for generating a laser light, the laser light being superposed with first and second laser light components of different frequencies from each other, thereby creating a beat of a first frequency on the laser light;

a rotational member having a rotational axis and rotating thereabout at a rotating speed in which a rotational angle of the rotational member per a unitary period of time varies depending upon elapsing of time, the rotational member having a light scattering plane;

a first detecting means for detecting the first frequency of the beat;

a splitting/irradiating means for splitting the laser beam into the first and second laser light components and irradiating the first laser light onto the light scattering plane of the rotational member to scatter the first laser light component;

a synthesizing means for synthesizing the scattered first laser light component and the second laser light component and providing a synthesized laser light, the synthesizing means outputting the synthesized laser light having a beat of a second frequency;

a second detecting means for detecting the second frequency of the beat; and an arithmetic means for computing the rotational angle based on the first and second frequencies of the beats.

The laser device emits a laser beam having beats caused by a parallel wave (hereinafter referred to as P wave) and a vertical wave (hereinafter referred to as S wave), which have mutually different frequencies and whose oscillating planes are normal to each other. A part of the beating laser beam is led to the first detecting means where the beat frequency (hereinafter referred to as fB) of the original laser beam is detected. The remaining laser beam is split into P and S waves by the splitting/irradiating means, and the P wave is irradiated onto a predetermined position of the rotational member and is scattered or reflected upon Doppler shifting according to the rotation of the rotational member. The scattered or reflected P wave and the S wave are led to the synthesizing means where both waves are synthesized to provide a laser beam with beats. The synthesized laser beam is led to the second detecting means where the beat frequency of the laser beam after the Doppler shift (hereinafter referred to as fD) is detected. The detected fD and fB are supplied to the arithmetic means, and the rotational angle of the rotational member is acquired.

The following equation (1) a the basic equation used by the arithmetic means.

$$\Delta f = (f/c) \cdot v \cdot (k-l) \tag{1}$$

where
$\Delta f$: varied amount of the frequency of scattered or reflected light,
c: speed of light,
v: tangential velocity vector,
k: directional vector of scattered or reflected light, and,
l: directional vector of incident light.

With the varied amount of frequency $\Delta f = fD - fB$ attained by the first and second detecting means, the rotational angle of the rotational member can be acquired by the arithmetic means using equation (1).

DETAILED DESCRIPTION OF THE PREFERRED EMBODIMENTS

Preferred embodiments of this invention will be described below with reference to the accompanying drawings.

Figure 1:
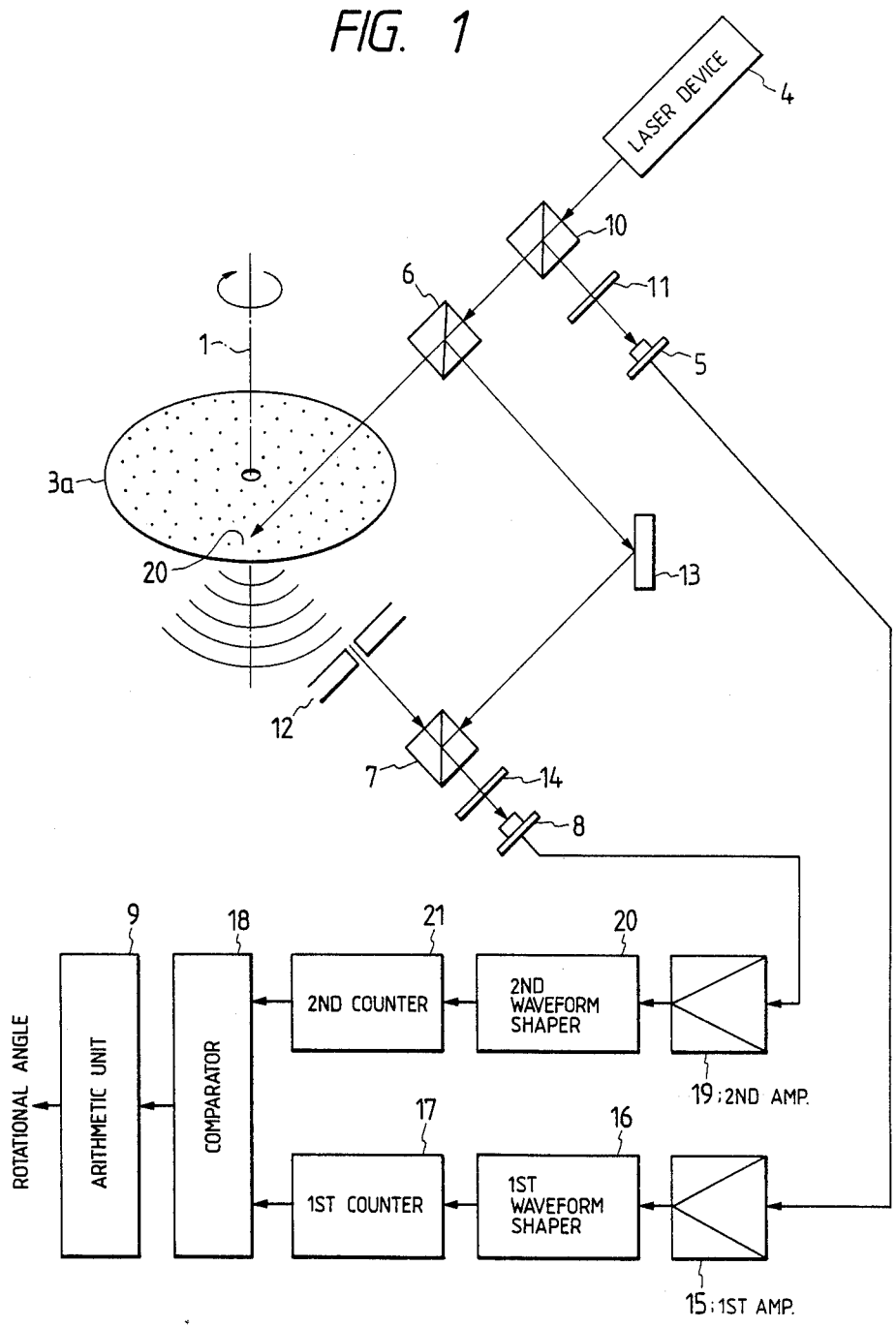
FIG. 1 is a diagram illustrating an arrangement of an optical rotary encoder according to a first embodiment of the present invention.
Figure 2:
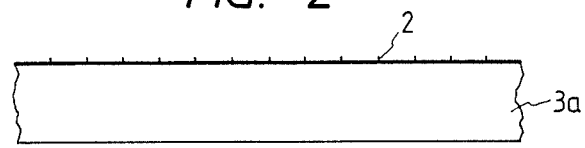
FIG. 2 is a side view of essential components of a rotational member according to the first embodiment.

FIG. 1 illustrates, in part, an arrangement of essential components of a rotary encoder according to a first embodiment of this invention, and FIG. 2 is a side view illustrating a segmental portion of a rotational member according to this embodiment.

The rotary encoder of this embodiment includes a transparent disk 3a mounted on a rotational shaft 1. Light-scattering particles 2 are formed on the surface of the disk 3a as shown in FIG. 2. A laser device 4 generates a laser beam with beats caused by P and S waves, which have different frequencies and whose oscillating planes are normal to each other. A first light receiving element 5 serving as a first detecting means detects the beat frequency of the laser beam. A first deflection beam splitter 6 serving as a splitting/irradiating means splits the laser beam into P and S waves and irradiates the P wave onto a predetermined position on the transparent disk 3a. A second deflection beam splitter 7 serving as a synthesizing means synthesizes the S wave split by the first deflection beam splitter 6 and the P wave scattered by the light-scattering particles 2 after the irradiation and having undergone the Doppler shift according to the rotation of the transparent disk 3a. A second light receiving element 8 serving as a second detecting means detects the beat frequency of the synthesized light beam from the second deflection beam splitter 7. An arithemetic unit 9 serving as an arithmetic means computes the rotational angle of the transparent disk 3a from the amount of the Doppler shift of the P wave which is attained by detection signals from the first and second light receiving elements 5 and 8. Other components needed to implement the arithmetic operation are also povided in conjunction with the arithmetic unit 9.

The laser beam emitted from the laser device 4 is split into reflection light and transmission light with a predetermined ratio by a beam splitter 10. The reflection light has 45° components of both the P and S waves superposed by a first polarizer 11 and is then led to the first light receiving element 5. The first light receiving element 5 detects fB of the laser beam from the laser device 4. The laser beam that has transmitted through the beam splitter 10 is split into an S wave (reflection light) and a P wave (transmission light) by the first deflection beam splitter 6. This P wave is led to the predetermined position on the transparent disk 3a and is scattered by the light-scattering particles 2. The scattered P wave has its frequency changed due to the Doppler shift according to the rotation of the transparent disk 3a. Only that scattered light component of the P wave which has a specific directivity is extracted by a mask 12 provided at a predetermined position and is led to the second deflection beam splitter 7. The S wave reflected by the first deflection beam splitter 6 is reflected by a mirror 13 and is led to the second deflection beam splitter 7. This beam splitter 7 permits the P wave to pass therethrough and reflects the S wave in the direction the P wave is transmitting, thereby providing a synthesized laser beam having beats that differ from those of the original laser beam by the amount of the frequency change caused by the Doppler shift. This synthesized laser beam has 45° components of its P and S waves superposed by a second polarizer 14 and is led to the second light receiving element 8 where fD of the received laser beam is detected. The signal having a frequency fB is amplified by a first amplifier 15 and is converted to a pulse signal by a first waveform shaper 16. The number of pulses (hereinafter referred to as CB) counted within a predetermined period of time by a first counter 17 is supplied to a comparator 18. The signal having a frequency fD has undergone a similar processing while passing through a second amplifier 19, and a second waveform shaper 20, and the number of pulses (hereinafter referred to as CD) counted within the predetermined period of time by a second counter 21 is supplied to the comparator 18. The comparator 18 then detects the difference between CB and CD and an output representing the difference therebetween is supplied to the arithmetic unit 9. Based on the received data, the arithmetic unit 9 computes the rotational angle of the transparent disk 3a.

A description will now be made with respect to the arithmetic operation executed by the arithmetic unit 9.

Figure 3:
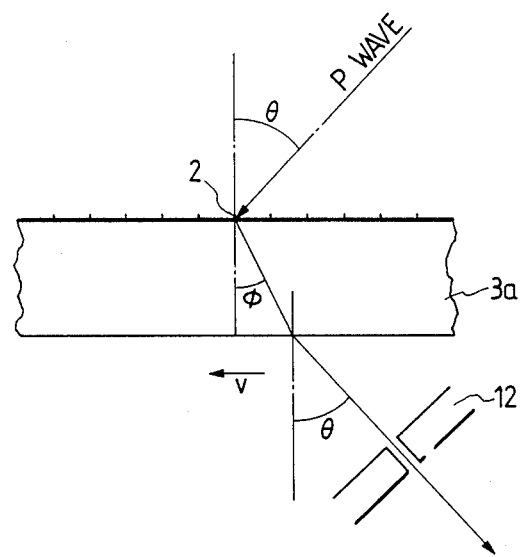
FIG. 3 is a diagram illustrating how a laser beam is irradiated onto the rotational member and scattered according to the first embodiment.
Figure 4:
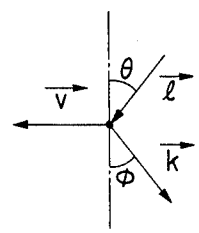
FIG. 4 is a vector diagram illustrating the relation between incident light, scattered light and speed according to this embodiment.

FIG. 3 illustrates how a P wave is irradiated onto the transparent disk 3a and scattered and FIG. 4 shows a vector diagram illustrating the relation among the incident light (I), scattered light (k) and speed (v) as shown in FIG. 3.

As shown in FIG. 3, the P wave having passed through the first deflection beam splitter 6 enters the transparent disk 3a at an incident angle θ. The mask 12 is so positioned as to only extract the P wave which leaves the transparent disk 3a at an angle $\theta$. Therefore, the P wave extracted by the mask 12 is that part of the light scattered by the light-scattering particles 2 which has been scattered at a scattering angle $\phi$ with respect to the vertical axis in association with the refractive index of the transparent disk 3a, as shown in FIG. 3.

Now, rewriting equation (1) based on the diagram of FIG. 4 yields:

$$\Delta fP = (fP/c)\cdot v\cdot(\sin\phi + \sin\theta) \quad (2)$$

where
- $\Delta fP$: amount of a frequency change in P wave caused by the Doppler shift,
- fP: original frequency of the P wave,
- c: speed of light,
- v: rotational velocity of the transparent disk 3a It should be noted that v would take a negative value when the transparent disk 3a rotates in the direction indicated by an arrow in FIG. 3.

Given that n is the refractive index of the transparent disk 3a and P is the wavelength of the P wave, equation (2) can be written as:

$$fP = (1/\lambda P)\cdot\{(n+1)/n\}\cdot v\cdot\sin\theta \quad (3)$$

Integrating equation (3) with respect to a predetermined period of time yields the distance of tangential movement, X1, based on the rotation of the transparent disk 3a, which can be expressed as:

$$X1 = \{n/(1+n)\}\cdot(\lambda P/\sin\theta)\cdot(CD - CB) \quad (4)$$

The rotational angle of the transparent disk 3a can be computed based on the moved distance X1 attained from the equation (4).

A description will now be made with respect to a second embodiment in which a transparent disk 3b having light-scattering particles formed therein is used as a rotational member.

Figure 5:
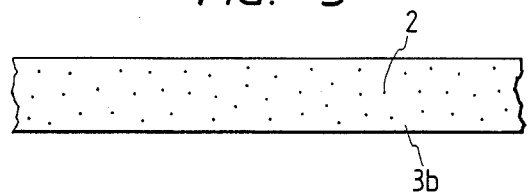
FIG. 5 is a side view of essential part of a rotational member according to a second embodiment of the present invention.
Figure 6:
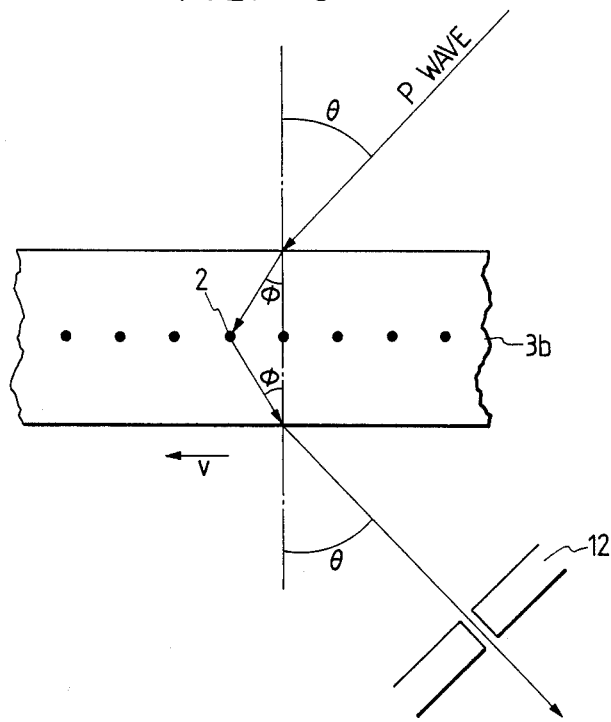
FIG. 6 is a diagram illustrating how a laser beam is irradiated onto the rotational member and scattered according to the second embodiment.
Figure 7:
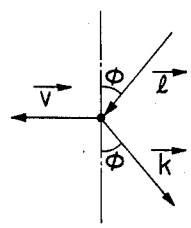
FIG. 7 is a vector diagram illustrating a relation between incident light, scattered light and speed according to the second embodiment.

FIG. 5 is a side view showing the essential section of the rotational member according to this embodiment, FIG. 6 illustrates how a P wave is irradiated onto the transparent disk 3b and scattered, and FIG. 7 shows a vector diagram illustrating the relation among the incident light (l), scattered light (k) and speed (v) as shown in FIG. 6.

That part of the second embodiment which is not illustrated in FIG. 6 has the same arrangement as that of the first embodiment. The mask 12 is so positioned as to extract only that part of the light having reached and been scattered by the light-scattering particles 2 in the transparent disk 3b at an incident angle $\theta$ and refraction angle $\phi$ which leaves the transparent disk 3b at an angle $\theta$ (see FIG. 6). For the sake of simplicity, FIG. 6 illustrates the P wave scattered by the light-scattering particles 2 which is located at the center of the transparent disk 3b in its depthwise direction; however, it is possible to extract light scattered by any light-scattering particle 2 located at a desired position in the depthwise direction of the disk 3b by shifting the mask 12 in radial direction in parallel to the surface of the disk 3b. In such a case, the same arithmetic operation described below is available.

In the second embodiment, equation (1) can be expressed as follows, as per the first embodiment:

$$fP = 2\cdot(fP/c)\cdot v\cdot\sin\phi \quad (5)$$

The distance of tangential movement, X2, based on the rotation of the transparent disk 3b is given as:

$$X2 = (n/2)\cdot(\lambda P/\sin\theta)\cdot(CD - CB) \quad (6)$$

A third embodiment will now be described.

Figure 8:
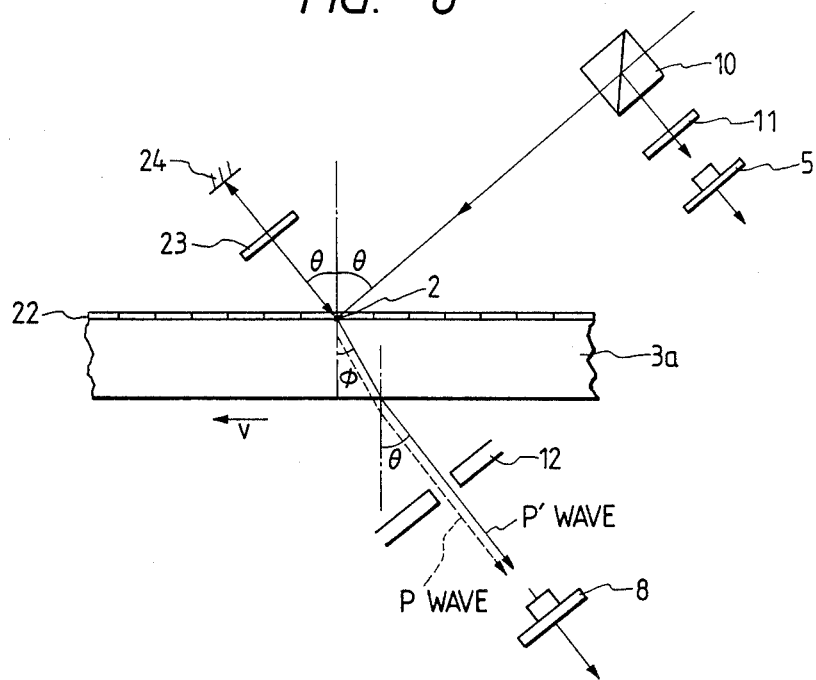
FIG. 8 is a diagram illustrating an arrangement of essential components of a rotary encoder according to a third embodiment of the present invention.
Figure 9:
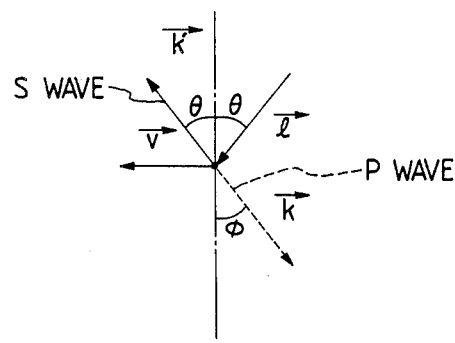
FIG. 9 is a vector diagram illustrating the relation between incident light, scattered light and speed according to the third embodiment.

FIG. 8 illustrates the essential section of the third embodiment, and FIG. 9 shows a vector diagram illustrating the relation among the incident light (l), scattered light (k) and speed (v).

According to this embodiment, a transparent disk 3a has light-scattering particles 2 on its surface and a deflection light transmission film 22 is provided on the top of the disk 3a so as to cover the particles 2. A quarter wavelength plate 23 (hereinafter referred to as $\lambda/4$ plate) and a mirror 24 as further provided to serve as splitting means and synthesizing means respectively.

As shown in FIG. 8, a laser beam emitted from a laser device (not shown) is split into reflection light and transmission light at a predetermined ratio by the beam splitter 10. The reflection light is led through the first polarizer 11 to the first light receiving element 5 to measured fB as in the case of the first embodiment. The transmission light, on the other hand, is incident to the transparent disk 3a at an incident angle $\theta$ and is split into a P wave (transmission light) and an S wave (reflection light) by the film 22. In this embodiment, the film 22 corresponds to the splitting/irradiating means. After reflected by the film 22, the S wave passes through the $\lambda/4$ plate 23 disposed in the reflecting direction, is reflected by the mirror 24 also disposed in the reflecting direction and is incident again to the transparent disk 3a at the angle $\theta$. At this time, the S wave has passed the $\lambda/4$ plate 23 twice and has therefore been converted to the P wave before passing the film 22. The mask 12 in this embodiment serves as synthesizing means and is so disposed as to select only that laser beam which leaves the transparent disk 3a at an angle $\theta$ and guides it to the second light receiving element 8. Accordingly, only the transmission light which leaves the transparent disk 3a at the angle $\theta$ without being affected by the Doppler shift is extracted from the S wave that have been converted by the mask 12 to the P wave (this S wave being hereinafter referred to as P' wave). Only the scattered light leaving the transparent disk 3a at the angle $\theta$ under the influence of the Doppler shift is extracted from the P wave, and this scattered light and the P' wave are synthesized. The resultant laser beam is led to the second light receiving element 8 for measurement of fD. The arithmetic operation executed thereafter is the same as that executed in the first embodiment.

A description will now be made with respect to the fourth embodiment.

Figure 10:
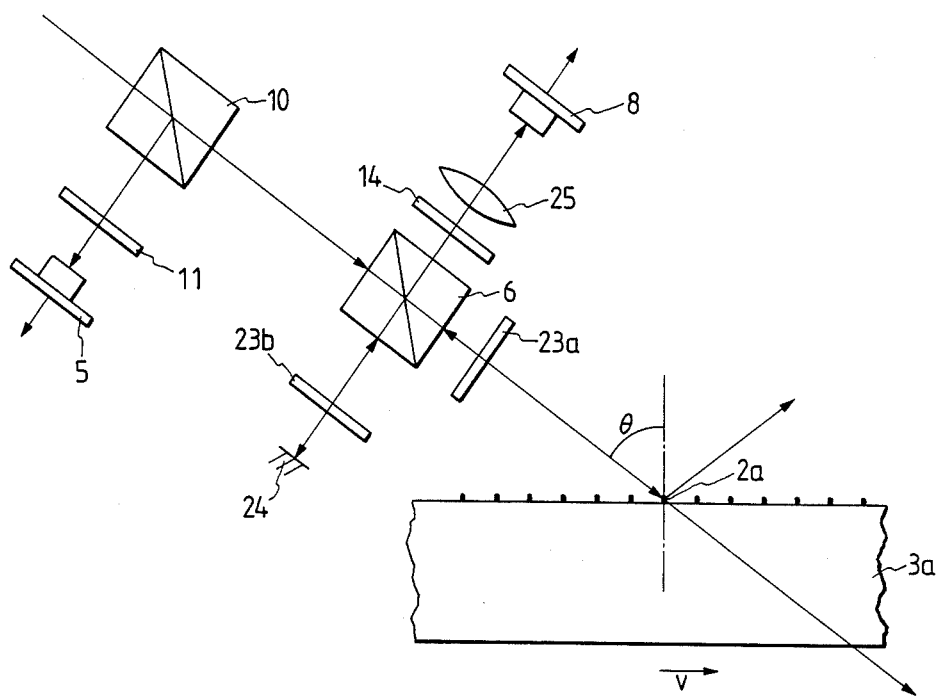
FIG. 10 is a diagram illustrating an arrangement of essential components of a rotary encoder according to a fourth embodiment of the present invention.
Figure 11:
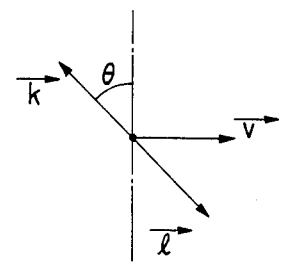
FIG. 11 is a vector diagram illustrating the relation between incident light, scattered light and speed according to the fourth embodiment.

FIG. 10 illustrates the essential section of this embodiment, and FIG. 11 shows a vector diagram illustrating the relation among the incident light (l), scattered light (k) and speed (v).

This embodiment is a rotary encoder in which a transparent disk 3a having Mie scattering particles 2a provided on its surface serves as a rotational member and a laser beam is observed on the same side as it is emitted.

As shown in FIG. 10, a laser beam passing the beam splitter 10 is split into P and S waves by the first deflection beam splitter 6. According to this embodiment, the beam splitter 6 serves as synthesizing means (to be described later) as well as splitting/irradiating means. The P wave having transmitted through the beam splitter 6 is Mie scatted due to the Mie scattering particles 21 on the transparent disk 3a after passing the λ/4 plate 23a. The light scattered backward due to the Mie scattering passes through the λ/4 plate 23a again to become an S wave (hereinafter referred as S' wave) and is led back to the beam splitter 6. Meanwhile, the S wave reflected by the beam splitter 6 is reflected by the mirror 24 after passing through the λ/4 plate 23b and passes through this λ/4 plate 23b again to become the P' wave before transmitting the beam splitter 6. The S' wave is reflected in the transmission direction of the P' wave by the beam splitter 6 and is collected by a collecting lens 25 after passing through the second polarizer 14 provided in the beam's advancing direction. The S' wave is then synthesized with the P' wave and the resultant wave is led to the second light receiving element 8 for measurement of fD. The frequency fB is measured in the same manner as is done in the first embodiment. The arithmetic operation to be executed hereafter is given in the modified form of equation (1) as follows:

$$\Delta fP = 2 \cdot (fP/c) \cdot v \cdot \sin \theta \quad (7).$$

The distance of tangential movement, X4, based on the rotation of the transparent disk 3a is given as:

$$X4 = \tfrac{1}{2} \cdot (\lambda/P \sin \theta) \cdot (CD - CB) \quad (8).$$

According to this embodiment, it is possible to observe fD also at the side surface of the transparent disk 3a, and the rotational member need not be transparent. In addition, according to this embodiment, the laser-emitting direction and laser-observing direction can be taken on the same side with respect to the rotational member, thus reducing the space necessary for mounting the present apparatus.

A description will now be made with respect to the fifth embodiment which utilizes reflected light, not scattered light.

Figure 12:
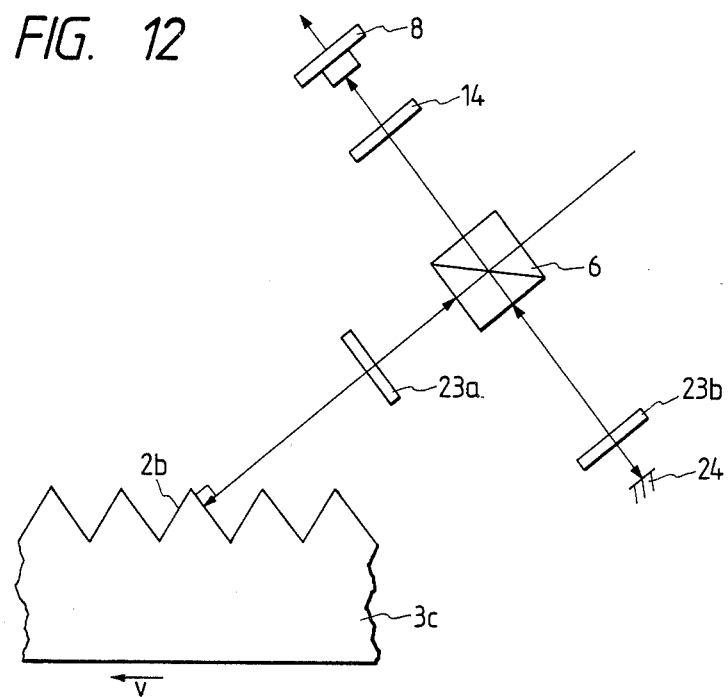
FIG. 12 is a diagram illustrating an arrangement of essential components of a rotary encoder according to a fifth embodiment of the present invention.

FIG. 12 illustrates an arrangement of the essential section of this embodiment. As shown in FIG. 12, according to the fifth embodiment, saw-tooth upheavals 2b are formed on the top of a rotational member 3c, a laser beam is irradiated onto the rotational member 3c from the direction normal to the inclined faces of the upheavals 2b and the rotational angle of the member 3c is obtained based on the reflection light which is influenced by the Doppler shift. The arrangement other than the rotational member is the same as that of the fourth embodiment.

A description will now be given of the sixth embodiment which utilizes irregular reflection.

Figure 13:
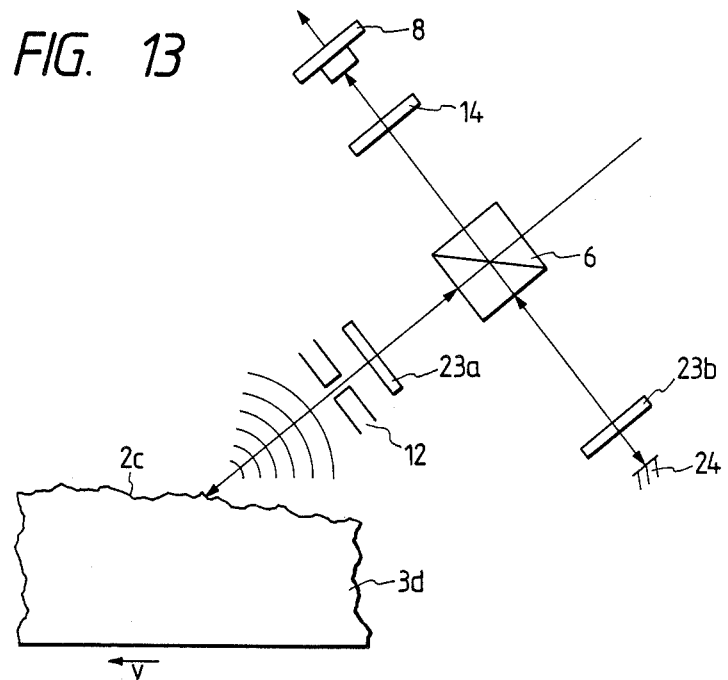
FIG. 13 is a diagram illustrating an arrangement of essential components of a rotary encoder according to a sixth embodiment of the present invention.
Figure 14:
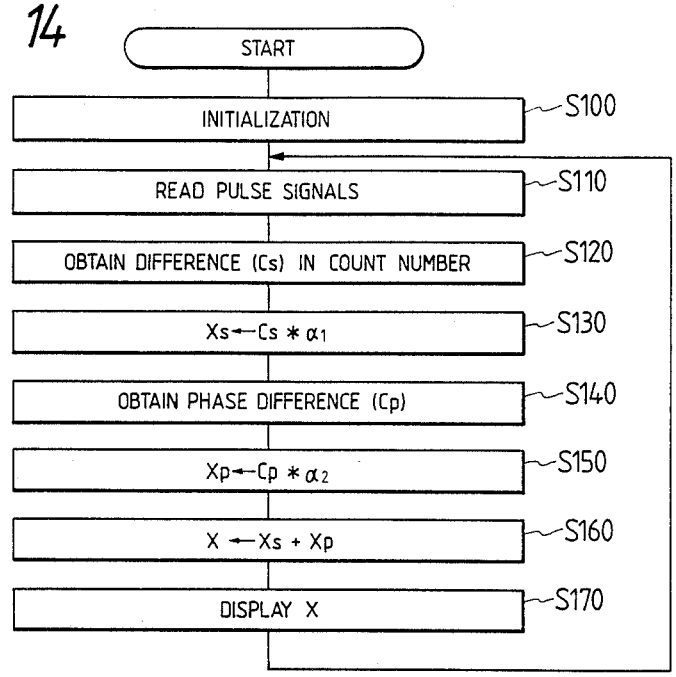
FIG. 14 is a flowchart for the arithmetic operation involved in this invention.
Figure 15:
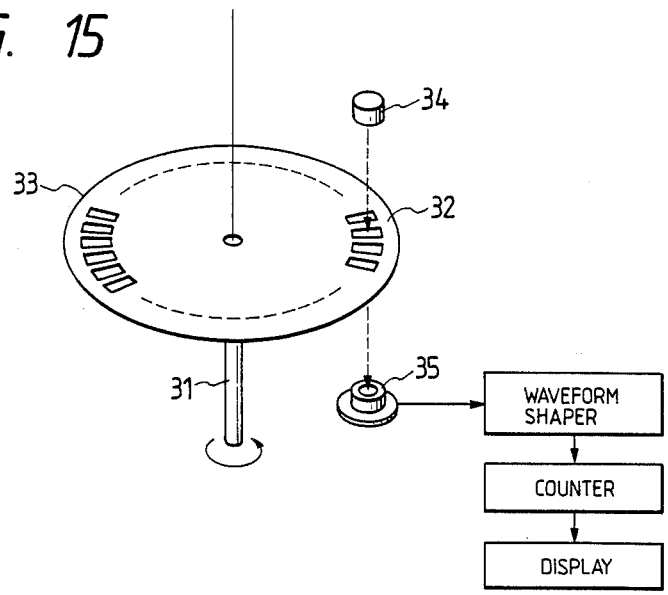
FIG. 15 is a diagram illustrating an arrangement of essential components of a conventional pulse scale rotary encoder.

FIG. 13 illustrates an arrangement of the essential components of this embodiment. As shown in FIG. 13, according to the sixth embodiment, projections 2c for causing irregular reflection are formed on the top of a rotational member 3d and the mask 12 is provided to selectively extract that laser beam which is irregularly reflected in a specific direction by the projections 2c. The other part of this embodiment has the same arrangement as that in the fourth embodiment.

In each of the above-described embodiments, with a He-Ne laser with a wavelength λ=0.6328 μm used a laser beam source, a transparent disk with a refraction index n=1.5, and a laser beam being irradiated on a position of a radius of 15 mm at an incident angle 0°-30°, the minimum detection distance Xmin is:

Xmin=0.7594 μm in the first and third embodiments as attained from equation (4), Xmin=0.9492 μm in the second embodiment as attrained from the equation (6), and Xmin=0.6328 μm in the fourth to sixth embodiments as attained from the equation (8).

To realize the same detection accuracy, the conventional pulse scale type rotary encoder requires about 124,000 slits for the first and third embodiments, about 99,000 slits for the second embodiment and about 149,000 slits for the fourth to sixth embodiments.

If the phase difference between fB and fD is further detected in each embodiment, the minimum detection accuracy is further improved significantly.

The rotational angle of the rotational member can be easily attained by dividing the moved distance by the radius.

A description will now be given of the arithmetic operation for computing the rotational angle based on the count numbers of, and the phase difference between, fB and fD using an electronic controller.

FIG. 4 is a flowchart illustrating the sequence of the arithmetic operation.

When the present rotary encoder starts measuring the frequencies, various parameters and flags are initialized in step 100. In the subsequent step 110, pulse signals of fB and fD within a predetermined period of time are read out, and the flow advances to step 120 where the difference between counted values of fB and fD, CS=CD−Cb, is attained based on the pulse signals. The flow then advances to step 130 in which the rotational angle $XS=CS \cdot a1$ is attained based on the count difference CS where α1 is a constant determined by the wavelength of the laser beam and its incident angle to the rotational member. In the next step 140, the phase difference between the read pulse signals, CP, is attained. In the next step S150, the rotational angle $XP=CP \cdot a2$ is attained based on the phase difference CP where 2 is a constant determined by the pulse signal resolution, etc. at the time the phase difference CP is detected. The flow then advances to step 160 where the rotational angle $X=XS+XP$ is attained using the previously-attained XS and XP. In the subsequent step 170, this rotational angle X within the constant minute time is displayed, and the flow then returns to step 110. The above arithmetic operation is repeated until the measurement is completed, thereby providing a rotational angle X for each constant unit of time.

Although this invention has been described with reference to particular embodiments, it is not restricted to those embodiments but can be modified in various manners within the scope and spirit of the invention. For instance, a thin film may replace the light-scattering particles to scatter light. Further, the light-scattering particles may be provided on the bottom surface, instead of the top, of a transparent disk as a rotational member in the first embodiment. Furthermore, in the fourth embodiment, a cylindrical body may be used as a rotational member with Mie scattering particles provided on the side surface of the cylindircal body. Similarly, in the fifth and sixth embodiments, upheavals may be provided on the side surface of a cylindrical body serving as a rotational member. In these cases, the locations of the laser device and deflection beam splitters can be concentrated toward the side surface of the rotational member. Moreover, the relation between incident light and scattered light need not be associated with the refractive index of the transparent disk, but can be varied in accordance with the structural conditions for the present apparatus.

Since the present rotary encoder computes the rotational angle of a rotational member based on a change in frequency of a laser beam that is scattered or reflected due to the Doppler shift, it can significantly improve the detection accuracy as compared with a pulse scale type rotary encoder. In addition, since the rotational angle of the rotational member is attained by the difference between the beat frequency of the original laser beam having beats and a laser beam resulting from the synthesizing of the original laser beam with a laser beam affected by the Doppler shift, it is sufficient to have only one irradiating position and it is unnecessary to utilize a complicated irradiating method for acquiring the rotational direction of the rotational member. Further, the detection error due to a variation in oscillation frequency of a laser device can be cancelled out. Furthermore, a Doppler type rotary encoder using diffraction gratings may cause an error due to eccentricity of the rotational member and an unequidistanced grating pattern and requires a complex system arrangement; however, with a specific relation between the incident angle and emerging angle of a laser beam with respect to the rotational member, the present rotary encoder will not cause such an error and can easily select and extract the scattered or reflected laser beam which has the mentioned specific relation with the original laser beam. What is more, since the amount of frequency change resulting from the Doppler shift is attained by detecting the beat frequency, the involved detector is simpler in this invention than the one which directly detecting the frequency of the laser beam.

As described above, this invention can provide a compact rotary encoder with a high accuracy.

What is claimed is:
1. A rotary encoder comprising:
   a laser device for generating a laser light, the laser light being superposed with first and second laser light components of different frequencies from each other, thereby creating a beat of a first frequency on the laser light;
   a rotational member having a rotational axis for rotating thereabout at a rotating speed in which a rotational angle of said rotational member per a unitary period of time varies depending upon elapsing of time, said rotational member having a light scattering plane;
   a first detecting means for detecting the first frequency of the beat;
   a splitting/irradiating means for splitting the laser beam into the first and second laser light components and irradiating the first laser light onto the light scattering plane of said rotational member to scatter the first laser light component;
   a synthesizing means for synthesizing the scattered first laser light component and the second laser light component and providing a synthesized laser light, said synthesizing means outputting the synthesized laser light having a beat of a second frequency;
   a second detecting means for detecting the second frequency of the beat; and
   an arithmetic means for computing the rotational angle based on the first and second frequencies of the beats.
2. A rotary encoder according to claim 1, wherein said light scattering plane is disposed on a surface of said rotational member and is formed with light-scattering particles.
3. A rotary encoder according to claim 1, wherein said light scattering plane is disposed in a location inside of said rotational member in substantially parallel with a surface of said rotational member and is formed with light-scattering particles.
4. A rotary encoder according to claim 2, wherein the first laser light component has a first oscillating plane and the second laser light component has a second oscillating plane wherein the first oscillating plane is normal to the second oscillating plane.
5. A rotary encoder according to claim 3, wherein the first laser light component has a first oscillating plane and the second laser light component has a second oscillating plane wherein the first oscillating plane is normal to the second oscillating plane.
6. A rotary encoder according to claim 3, wherein said arithmetic means comprises a first amplifying means receiving the first frequency of the beat for amplifying the the first frequency thereof and outputting an amplified first frequency, a second amplifying means receiving the second frequency of the beat for amplifying the second frequency thereof and outputting an amplified second frequency, a first waveform shaping means receiving the amplified first frequency for subjecting the amplified first frequency to waveform shaping and outputting a first pulse signal having pulse numbers at the first frequency, a second waveform shaping means receiving the amplified second frequency for subjecting the amplified second frequency to waveform shaping and outputting a second pulse signal having pulse numbers at the second frequency, a first counting means for counting a number of pulses of the first pulse signal during the unitary period of time and outputting a first count number, a second counting means for counting a number of pulses of the second pulse signal during the unitary period of time and outputting a second count number, a comparison means receiving the first and second count numbers for comparing these count numbers and outputting a difference signal representing a difference in count between the first and second count numbers, and a computing means for computing the rotational angle in response to the difference signal.
7. A rotary encoder according to claim 4, wherein said arithmetic means comprises a first amplifying means receiving the first frequency of the beat for amplifying the the first frequency thereof and outputting an amplified first frequency, a second amplifying means receiving the second frequency of the beat for amplifying the second frequency thereof and outputting an amplified second frequency, a first waveform shaping means receiving the amplified first frequency for subjecting the amplified first frequency to waveform shaping and outputting a first pulse signal having pulse numbers at the first frequency, a second waveform shaping means receiving the amplified second frequency for subjecting the amplified second frequency to waveform shaping and outputting a second pulse signal having pulse numbers at the second frequency, a first counting means for counting a number of pulses of the first pulse signal during the unitary period of time and outputting a first count number, a second counting means for counting a number of pulses of the second pulse signal during the unitary period of time and outputting a second count number, a comparison means receiving the first and second count numbers for comparing these count numbers and outputting a difference signal representing a difference in count between the first and second count numbers, and a computing means for computing the rotational angle in response to the difference signal.

8. A rotary encoder according to claim 6, further comprising a splitting means for receiving the laser light generated from said laser device and splitting the received laser light into a first part of the laser light and a second part of the laser light, and wherein said first detecting means receives the first part of the laser light and said splitting/irradiating means receives the second part of the laser light.

9. A rotary encoder according to claim 7, further comprising a splitting means for receiving the laser light generated from said laser device and splitting the received laser light into a first part of the laser light and a second part of the laser light, and wherein said first detecting means receives the first part of the laser light and said splitting/irradiating means receives the second part of the laser light.

10. A rotary encoder comprising:
a laser device for generating a laser light, the laser light being superposed with first and second laser light components of different frequencies from each other, thereby creating a beat of a first frequency on the laser light;
a rotational member having a rotational axis for rotating thereabout at a rotating speed in which a rotational angle of said rotational member per a unitary period of time varies depending upon elapsing of time, said rotational member having a light scattering plane;
a first detecting means for detecting the first frequency of the beat;
a splitting means for splitting the laser beam into the first and second laser light components and allowing the first laser light to be applied to the light scattering plane of said rotational member to scatter the first laser light component;
a wavelength converting means receiving the second laser light component for converting the second laser light component to the first laser component and applying the second-to-first converted laser light component to the light scattering plane;
a synthesizing means for synthesizing the scattered first laser light component and the second-to-first converted laser light component and providing a synthesized laser light, said synthesizing means outputting the synthesized laser light having a beat of a second frequency;
a second detecting means for detecting the second predetermined frequency of the beat; and
an arithmetic means for computing the rotational angle based on the first and second frequencies of the beats.

11. A rotary encoder according to claim 10, wherein said light scattering plane is disposed on a surface of said rotational member and is formed with light-scattering particles.

12. A rotary encoder according to claim 11, wherein said splitting means comprises a deflection light transmission film provided on the surface of said rotational member to cover the light-scatting particles.

13. A rotary encoder according to claim 12, wherein said wavelength converting means comprises a quarter wavelength plate and a reflection mirror, said quarter wavelength plate being disposed to pass through the second laser light component and direct the second laser light toward said reflection mirror and to pass through the reflected second laser light component and direct the reflected second laser light component to the surface of said rotational member.

14. A rotary encoder according to claim 13, wherein said arithmetic means comprises a first amplifying means receiving the first frequency of the beat for amplifying the the first frequency thereof and outputting an amplified first frequency, a second amplifying means receiving the second frequency of the beat for amplifying the second frequency thereof and outputting an amplified second frequency, a first waveform shaping means receiving the amplified first frequency for subjecting the amplified first frequency to waveform shaping and outputting a first pulse signal having pulse numbers at the first frequency, a second waveform shaping means receiving the amplified second frequency for subjecting the amplified second frequency to waveform shaping and outputtting a second pulse signal having pulse numbers at the second frequency, a first counting means for counting a number of pulses of the first pulse signal during the unitary period of time and outputting a first count number, a second counting means for counting a number of pulses of the second pulse signal during the unitary period of time and outputting a second count number, a comparison means receiving the first and second count numbers for comparing these count numbers and outputting a difference signal representing a difference in count between the first and second count numbers, and a computing means for computing the rotational angle in response to the difference signal.

15. A rotary encoder comprising:
a laser device for generating a laser light, the laser light being superposed with first and second laser light components of different frequencies from each other, thereby creating a beat of a first frequency on the laser light;
a rotational member having a rotational axis for rotating thereabout at a rotating speed in which a rotational angle of said rotational member per a unitary period of time varies depending upon elapsing of time, said rotational member having a light scattering plane;
a first detecting means for detecting the first frequency of the beat;
a splitting/irradiating means for splitting the laser beam into the first and second laser light components and irradiating the first laser light onto the light scattering plane of said rotational member to scatter the first laser light component;
a wavelength converting means for converting the scattered first laser light component to the second laser light component subjected to scattering and providing a first-to-second converted laser light component;
a synthesizing means for synthesizing the second laser light component and the first-to-second converted laser light component and providing a synthesized laser light, said synthesizing means outputting the synthesized laser light having a beat of a second frequency;
a second detecting means for detecting the second frequency of the beat; and
an arithmetic means for computing the rotational angle based on the first and second frequencies of the beats.

16. A rotary encoder according to claim 15, wherein said light scattering plane is disposed on a surface of said rotational member and is formed with Mie scattering-particles.

17. A rotary encoder according to claim 16, wherein said wavelength converting means comprises a quarter wavelength converting plate.

18. A rotary encoder according to claim 17, wherein said arithmetic means comprises a first amplifying means receiving the first frequency of the beat for amplifying the the first frequency thereof and outputting an amplified first frequency, a second amplifying means receiving the second frequency of the beat for amplifying the second frequency thereof and outputting an amplified second frequency, a first waveform shaping means receiving the amplified first frequency for subjecting the amplified first frequency to waveform shaping and outputting a first pulse signal having pulse numbers at the first frequency, a second waveform shaping means receiving the amplified second frequency for subjecting the amplified second frequency to waveform shaping and outputtting a second pulse signal having pulse numbers at the second frequency, a first counting means for counting a number of pulses of the first pulse signal during the unitary period of time and outputting a first count number, a second counting means for counting a number of pulses of the second pulse signal during the unitary period of time and outputting a second count number, a comparison means receiving the first and second count numbers for comparing these count numbers and outputting a difference signal representing a difference in count between the first and second count numbers, and a computing means for computing the rotational angle in response to the difference signal.

19. A rotary encoder comprising:
a laser device for generating a laser light, the laser light being superposed with first and second laser light components of different frequencies from each other, thereby creating a beat of a first frequency on the laser light;
a rotational member having a rotational axis for rotating thereabout at a rotating speed in which a rotational angle of said rotational member per a unitary period of time varies depending upon elapsing of time, said rotational member having a light reflection surface;
a first detecting means for detecting the first frequency of the beat;
a splitting/irradiating means for splitting the laser beam into the first and second laser light components and irradiating the first laser light onto the light reflection surface of said rotational member to have the first laser light component reflect therefrom;
a synthesizing means for synthesizing the reflected first laser light component and the second laser light component and providing a synthesized laser light, said synthesizing means outputting the synthesized laser light having a beat of a second frequency;
a second detecting means for detecting the second frequency of the beat; and
an arithmetic means for computing the rotational angle based on the first and second frequencies of the beats.

20. A rotary encoder according to claim 19, wherein the light reflection surface of the rotational member is formed with saw-tooth projections, said each of said projections having inclined faces.

21. A rotary encoder according to claim 20, wherein the first laser light component is irradiated onto the light reflection surface normal to the inclined faces of the upheavals.

22. A rotary encoder according to claim 19, wherein the light reflection surface of the rotational member is formed with irregular reflections.

23. A rotary encoder according to claim 22, wherein the first laser light component has a first oscillating surface and the second laser light component has a second oscillating surface wherein the first oscillating surface is normal to the second oscillating surface.

24. A rotary encoder according to claim 23, wherein said arithmetic means comprises a first amplifying means receiving the first frequency of the beat for amplifying the the first frequency thereof and outputting an amplified first frequency, a second amplifying means receiving the second frequency of the beat for amplifying the second frequency thereof and outputting an amplified second frequency, a first waveform shaping means receiving the amplified first frequency for subjecting the amplified first frequency to waveform shaping and outputting a first pulse signal having pulse numbers at the first frequency, a second waveform shaping means receiving the amplified second frequency for subjecting the amplified second frequency to waveform shaping and outputtting a second pulse signal having pulse numbers at the second frequency, a first counting means for counting a number of pulses of the first pulse signal during the unitary period of time and outputting a first count number, a second counting means for counting a number of pulses of the second pulse signal during the unitary period of time and outputting a second count number, a comparison means receiving the first and second count numbers for comparing these count numbers and outputting a difference signal representing a difference in count between the first and second count numbers, and a computing means for computing the rotational angle in response to the difference signal.

* * * * *